(12) United States Patent
Taylor

(10) Patent No.: US 10,312,613 B2
(45) Date of Patent: Jun. 4, 2019

(54) INTERPOSER ASSEMBLY AND METHOD

(71) Applicant: Amphenol InterCon Systems, Inc., Etters, PA (US)

(72) Inventor: Paul R. Taylor, Mechanicsburg, PA (US)

(73) Assignee: Amphenol InterCon Systems, Inc., Etters, PA (US)

( * ) Notice: Subject to any disclaimer, the term of this patent is extended or adjusted under 35 U.S.C. 154(b) by 16 days.

(21) Appl. No.: 15/809,681

(22) Filed: Nov. 10, 2017

(65) Prior Publication Data

US 2018/0301835 A1 Oct. 18, 2018

Related U.S. Application Data

(60) Provisional application No. 62/486,604, filed on Apr. 18, 2017.

(51) Int. Cl.
| | | |
|---|---|---|
| *H01R 12/70* | (2011.01) |
| *H05K 7/02* | (2006.01) |
| *H01R 12/71* | (2011.01) |
| *H01R 12/73* | (2011.01) |
| *H01R 13/24* | (2006.01) |
| *H01R 107/00* | (2006.01) |

(52) U.S. Cl.
CPC ......... *H01R 12/7082* (2013.01); *H05K 7/023* (2013.01); *H01R 12/714* (2013.01); *H01R 12/73* (2013.01); *H01R 13/2428* (2013.01); *H01R 2107/00* (2013.01); *H05K 2201/10378* (2013.01)

(58) Field of Classification Search
CPC ................................................. H01R 12/7082

USPC ........................................................ 174/255
See application file for complete search history.

(56) References Cited

U.S. PATENT DOCUMENTS

| | | |
|---|---|---|
| 5,326,289 A | 7/1994 | Leisey |
| 7,040,902 B2 | 5/2006 | Li |
| 7,556,503 B2 | 7/2009 | Vinther |
| 7,629,534 B2 | 12/2009 | Ikeda et al. |
| 8,431,830 B2 | 4/2013 | Tamura |
| 8,562,359 B2 | 10/2013 | Alden, III et al. |
| 9,172,161 B2 | 10/2015 | Walden et al. |
| 9,425,525 B2 | 8/2016 | Walden et al. |
| 10,003,145 B1* | 6/2018 | Annis ................... H01R 12/716 |
| 2006/0261491 A1* | 11/2006 | Soeta .................. H01L 23/3128 257/777 |
| 2010/0087072 A1* | 4/2010 | Neidich ............. H01R 13/2428 439/66 |

(Continued)

FOREIGN PATENT DOCUMENTS

| | | |
|---|---|---|
| JP | 2011-502339 A | 1/2011 |
| JP | 2015-026502 A | 2/2015 |

OTHER PUBLICATIONS

Taylor, U.S. Appl. No. 62/428,715 for "Interposer Assembly, Contact, Method" filed Dec. 1, 2016.

*Primary Examiner* — Stanley Tso
(74) *Attorney, Agent, or Firm* — Hooker & Habib, P.C.

(57) ABSTRACT

An interposer assembly including a plate and a plurality of metal contacts extending through passages in the plate for forming electrical connections with pads on overlying and underlying substrates. The contacts include a number of contact units with elastic cantilever and torsion springs. Current flows through the contact units with minimum resistance.

25 Claims, 10 Drawing Sheets

(56) References Cited

U.S. PATENT DOCUMENTS

| | | | |
|---|---|---|---|
| 2011/0059631 A1* | 3/2011 | Tamura | H01R 12/7082 439/66 |
| 2012/0184157 A1* | 7/2012 | Alden | H01R 12/7082 439/884 |
| 2013/0078860 A1* | 3/2013 | Rathburn | H01R 12/7082 439/620.01 |

* cited by examiner

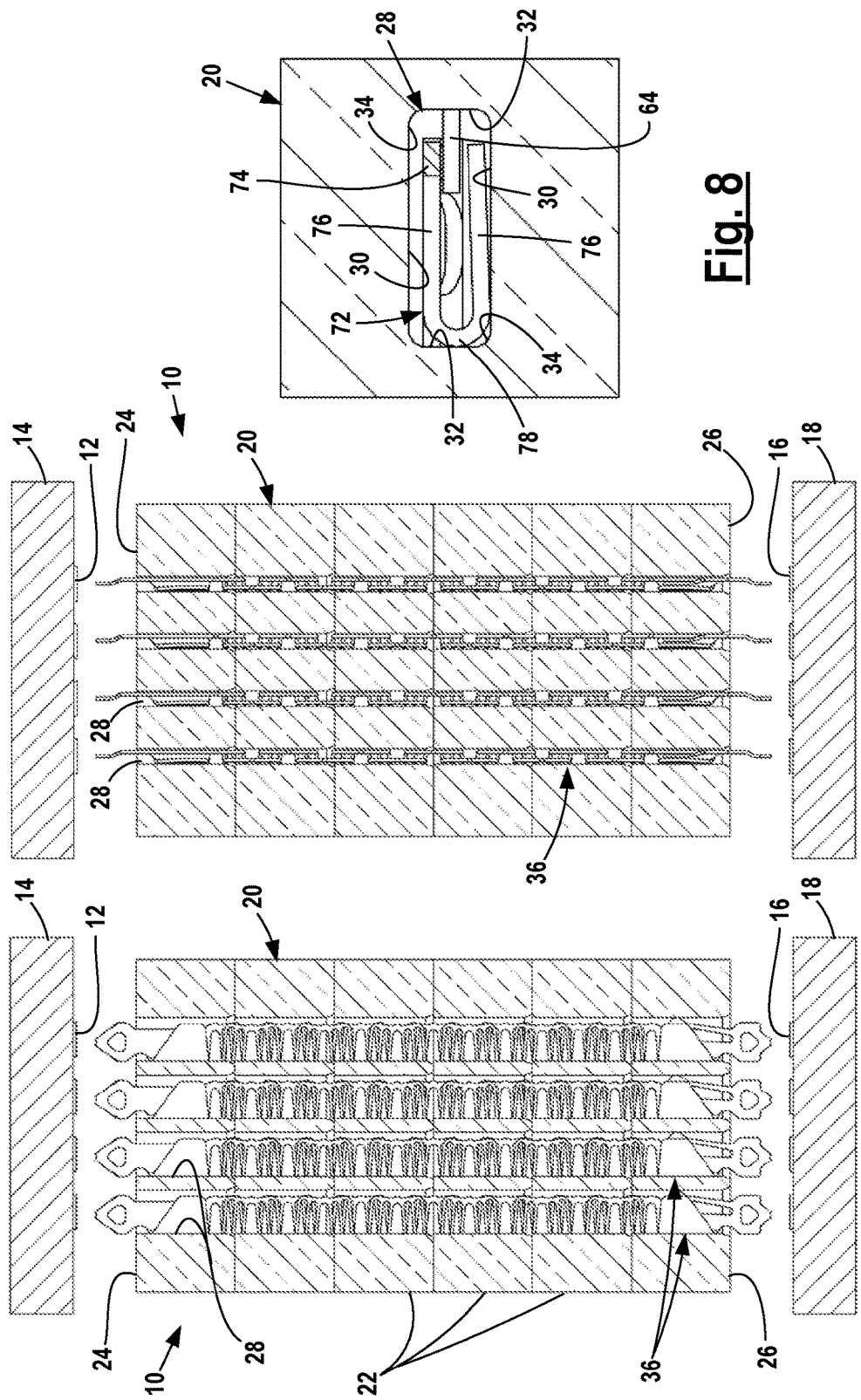

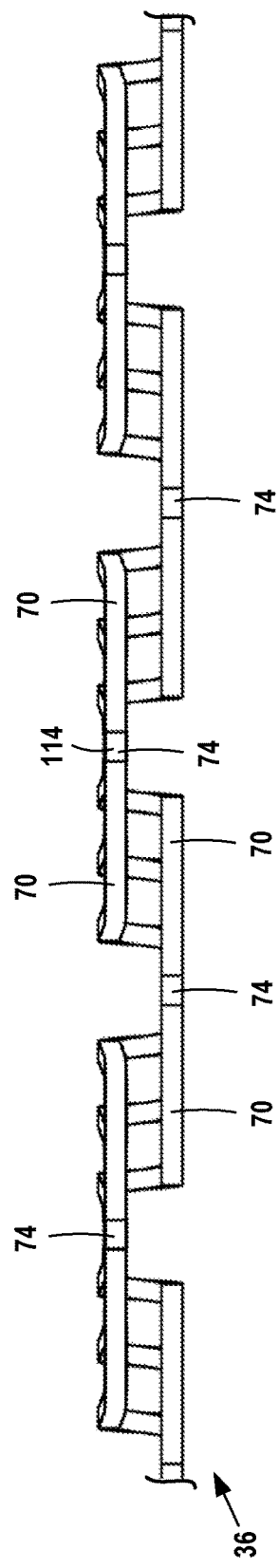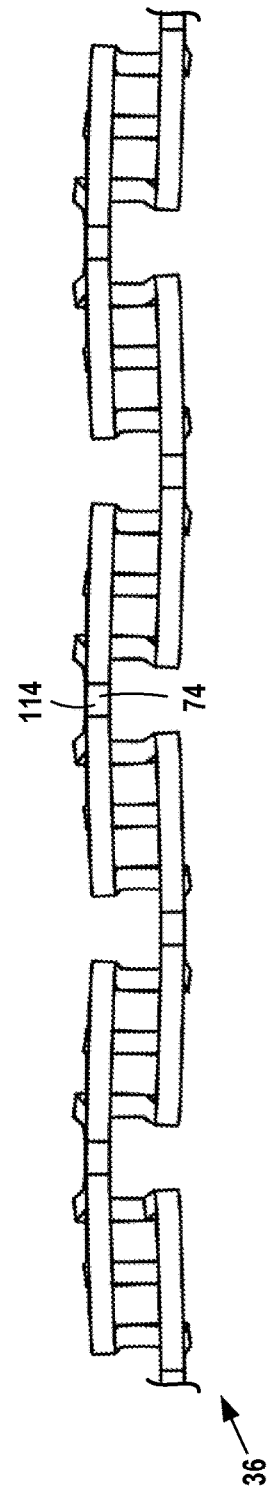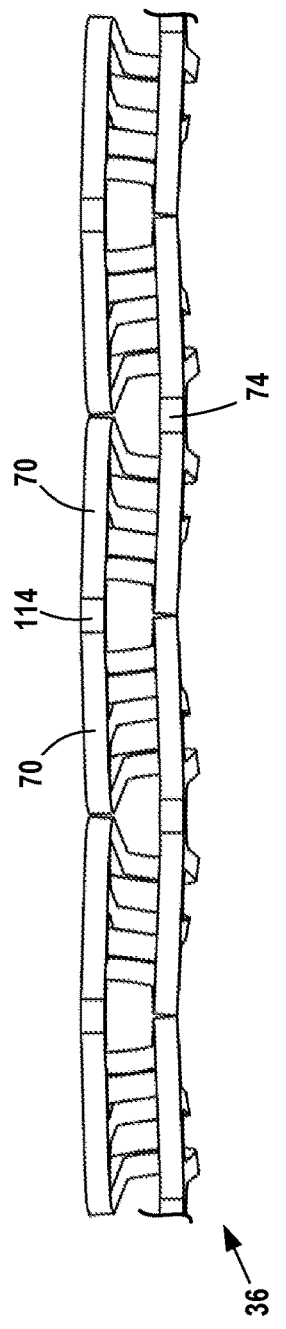

INTERPOSER ASSEMBLY AND METHOD

BACKGROUND OF THE DISCLOSURE

Interposer assemblies with molded plastic plates and metal contacts inserted in the plates are used for forming electrical connections between contact pads on opposed substrates. The contacts and pads are spaced very close together in land grid array rows and columns to establish a large number of differential pair signal and ground connections extending through the plate.

Conventional interposer assemblies use contacts formed from metal strips with contact ends which engage pads on the substrates. Each contact is fitted in a passage extending through the plate. The strip has two functions. It establishes a circuit path between pads on opposed substrates and it includes a spring which provides contact pressure at the pads. Sandwiching an interposer assembly between opposed substrates compresses the contacts in the assembly plate to stress the springs and provide contact pressure required for good electrical connections between the contacts and pads.

Conventional interposer assembly contacts have inefficient springs with limited energy storage in the strip due to a single mode of elastic beam strain concentrated in the ends of the contact at the top and bottom of the plate. Spring performance can be increased by forming the contacts from copper strip stock with expensive performance-enhancing alloys, such as beryllium copper. Use of these alloys undesirably increases the cost of the contacts.

Thus, there is a need for an interposer assembly for forming reliable electrical connections between opposed substrate pads using contacts, preferably formed from metal without expensive strengthening alloys, where the contacts are both highly conductive and highly compliant to assure reliable electrical connections between pads.

The springs in the contacts should be mechanically efficient so that compressed energy is stored through elastic strain in the contacts and is recovered when the substrates are removed from engagement with the contacts. Frictional loss, due to engagement between the contacts and the walls of the contact passages extending through the plate, should be minimized. Compliance of the contact and reliable electrical connections with the opposed pads should be enhanced.

SUMMARY OF THE DISCLOSURE

The disclosed interposer assembly has an improved plate and contacts for forming electrical connections between pads on opposed substrates. Each contact includes a number of like contact units spaced along the contact. Each contact unit has a number of springs which are elastically compressed when the interposer assembly is compressed between substrates. The contact units move freely in through passages in the plate during compression and expansion of the contact, assuring independent behavior for each contact within the array. When the spacing between substrates increases as they retract from the assembly, the contact units expand and energy stored in the compressed contact units extends the contact ends outwardly from the plate. As a result, the contacts are highly compliant and maintain effective contact pressure engagement with the pads.

The contacts form low-resistance circuit paths between opposed pairs of pads. Current flows equally through the springs in each contact unit to minimize resistance and temperature increase.

BRIEF DESCRIPTION OF THE DRAWINGS

FIGS. 3 and 4 are sectional views of the interposer assembly taken along lines 3-3 and 4-4 of FIG. 2 respectively with upper and lower substrates shown;

FIG. 8 is a sectional view taken along line 8-8 of FIG. 6;

FIG. 24 is an enlarged side view of uncompressed contact units;

FIG. 25 is an enlarged side view of partially compressed contact units;

FIG. 26 is an enlarged side view of fully compressed contact units; and

DESCRIPTION OF PREFERRED EMBODIMENTS

Figure 2:
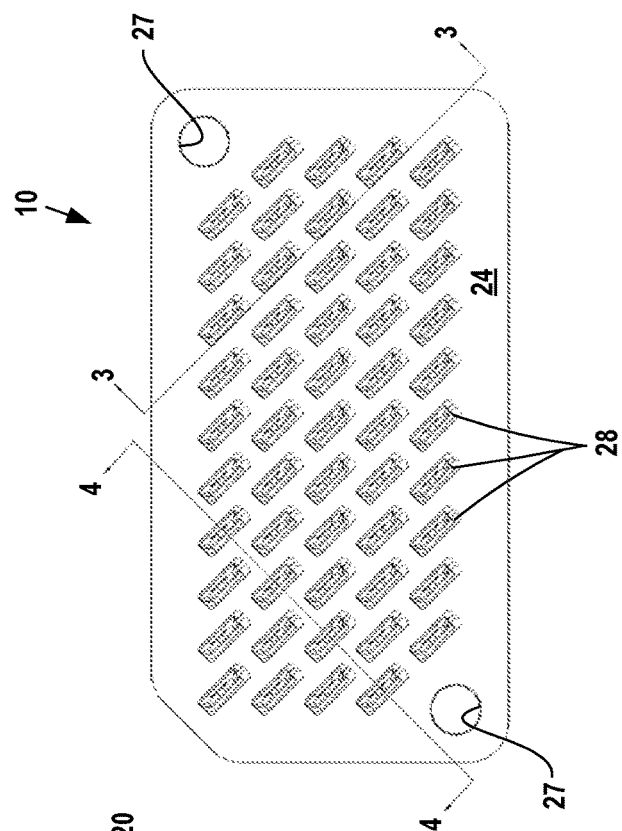
FIG. 2 is a very top view of the interposer assembly.
Figure 1:
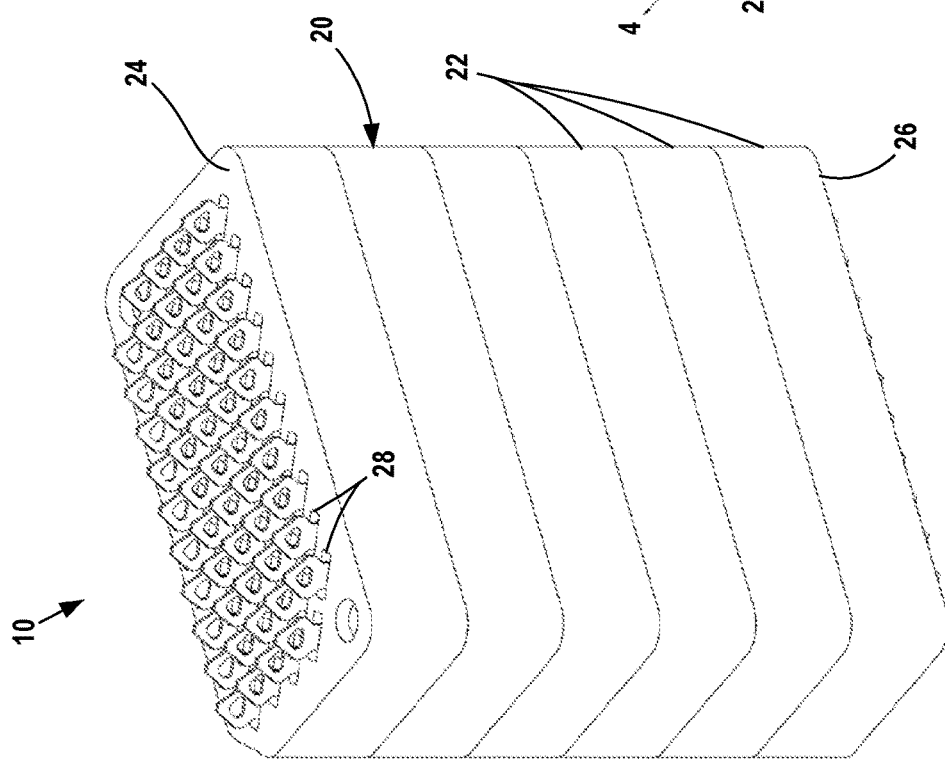
FIG. 1 is a perspective view of an interposer assembly according to invention.
Figure 5:
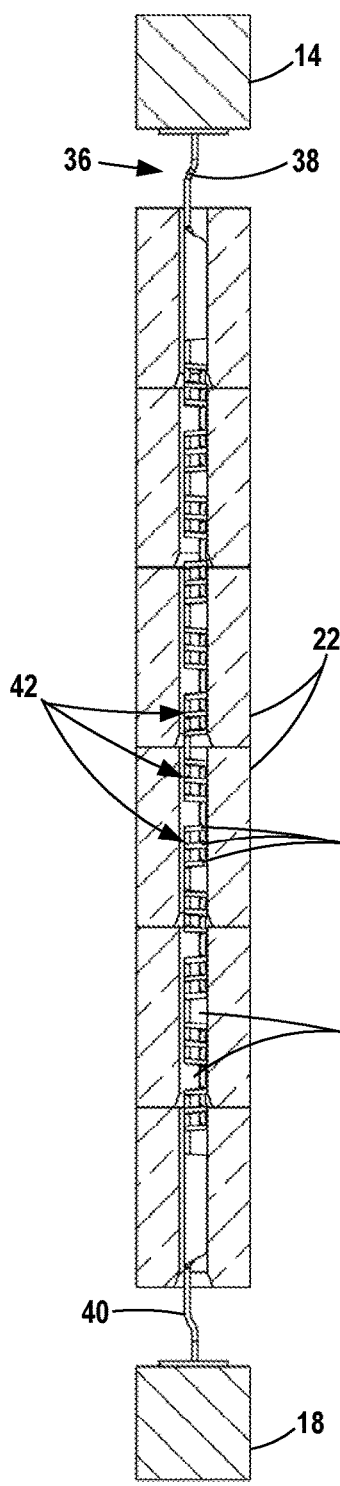
FIGS. 5, 6 and 7 are vertical sectional views illustrating a contact in an assembly passage engaging pads on the substrates before compression.
Figure 6:
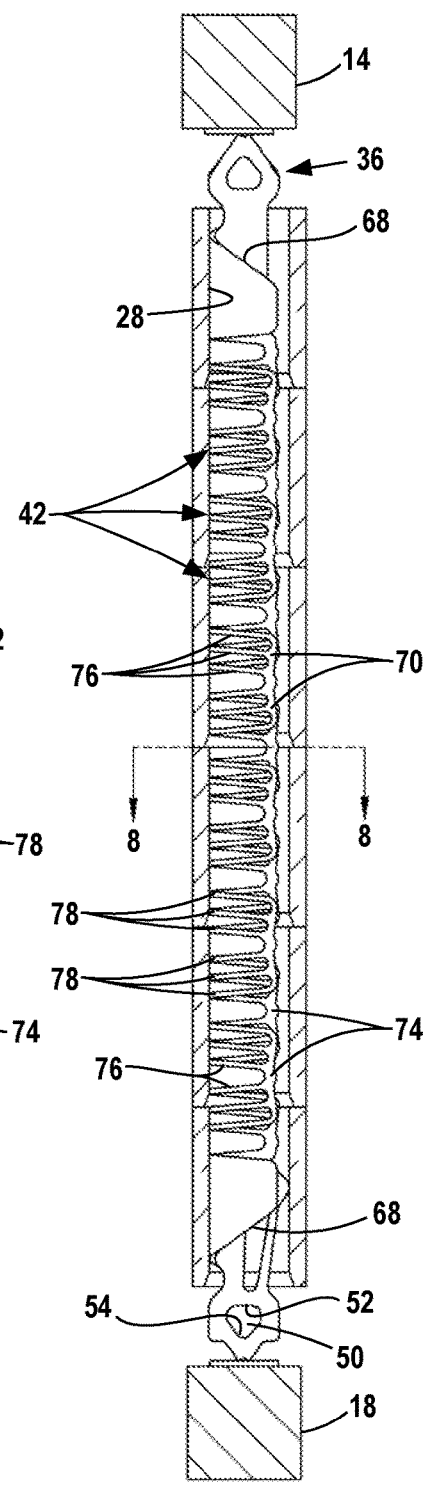
Figure 7:
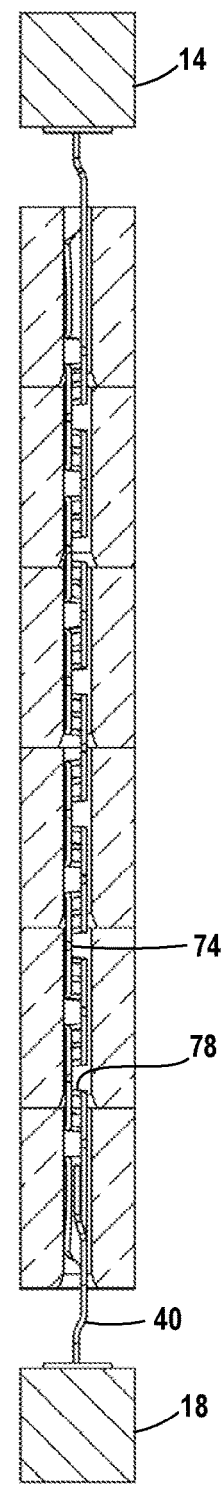
Figure 9:
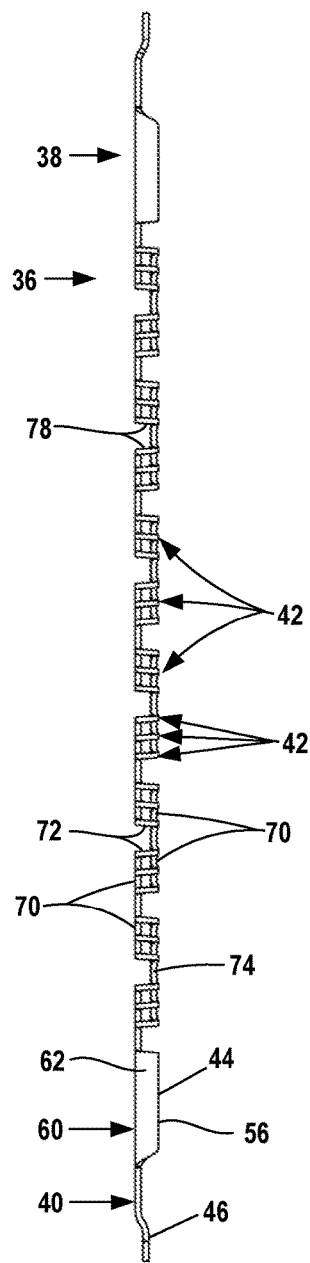
FIGS. 9-12 are side views of an uncompressed contact.

Interposer assembly 10 forms electrical connections between opposed pairs of contact pads 12 on the lower surface of substrate 14 and contact pads 16 on the upper surface of substrate 18. The pads 12 and 16 may be arranged in rows and columns in a land grid array.

Assembly 10 has a rectangular insulating body 20 formed from a number of stacked molded plastic wafers 22 extending between top surface 24 and bottom surface 26. Wafer alignment pins (not illustrated) are fitted in pin passages 27 in the wafers. Assembly 10 is suitably supported between the substrates.

A plurality of contact passages 28 extend perpendicularly through body 20 between surfaces 24 and 26. Passages 28 have a uniform rectangular cross section shown in FIG. 8 with opposed parallel long walls 30 and opposed parallel short walls 32. Passage corners 34 may be rounded.

An elongate one-piece metal contact 36 is fitted in each contact passage 28. Each contact 36 has an upper contact end 38, a lower contact end 40, and a number of U-shaped contact units 42 spaced along the length of the contact between ends 38 and 40. Contact 36 has twelve like units 42. The number of units may vary as required by the height of assembly body 20 and contact pressure and compliance requirements.

The lower contact end 40 includes a U-shaped attachment member 44 located below units 42 and a contact tip 46. Tip 46 has two spaced contact points 48 at the bottom of the contact and an insertion/withdrawal opening 50 above the points 48. Tip 46 is centrally located below units 42. Opening 50 has a flat insertion surface 52 away from tip 46. Insertion surfaces 43 face away from the units. A V-shaped withdrawal recess 54 in opening 50 is adjacent points 48. A tool may be pressed against surface 43 or surface 52 to insert contact 36 into a passage 28. A narrow tool may be inserted into opening 50 and seated in recess 54 to withdraw the contact out from passage 28.

Attachment member 44 includes an alignment fold 56 for aligning the lower end of the contact in passage 28. Fold 56 has opposed flat guide walls 58 and 60 which are connected by U-bend 62. Walls 58 and 60 extend along the lower ends of passage long walls 30 when contact 36 is in the passage 28.

Cantilever retention arm 64 extends inwardly from tip 46 between guide walls 58 and 60. Compliant friction projection 66 on the free end of arm 64 faces out from contact end 40 and is compressed to engage a passage short wall 32 when the contact is in a passage, establishing a moderate retaining force which maintains the contacts in position within the cavity without significantly reducing contact independence. The arm 64 attaches the contact end 40 to the lower end of passage 28. This arm 64 becomes deflected only after the entire spring section has entered the passage, such that no frictional restriction occurs which would lead to spring section compression. As a result, the contact body freely meanders from one side to the other side within the contact passage in both length and width of the passage sectional profile through the entire insertion process.

Alignment fold 56 has a diagonal insertion surface 68 which faces outwardly from units 42 to guide the end of the contact into a passage 28 without striking bottom surface 26 of body 20. Upper contact end 38 is like lower contact end 40 without retention arm 64. End 38 also does not contain insertion surface 43, which establishes an uninterrupted lead-in angle for the end of the contact inserted first into the passage.

Twelve like U-shaped contact units 42 are spaced along the length of contact 36 between ends 38 and 40. The contact units are electrically conductive and elastically resilient. Each unit 42 has two spaced elongate support strips 70 overlying each other and three like U-shaped spring arms 72 connecting strips 70. The strips 70 extend along the length of the contact at one passage short wall 32. The arms 72 each include two legs 76 extending from strips 70 across the passage along the long walls 30 toward the opposed short wall 32, and U-bend 78 joining the legs at the opposed short wall. The arms 72 form three series-oriented physical and electrical connections between strips 70 in each contact unit. Spring arms 72 may have a rectangular or square transverse cross section. Bridge 74 joins one end of each strip 70 to the end of a strip 70 in an adjacent contact unit located on the same side of the contact.

When units 42 are not compressed, the straight spring legs 76 in each spring arm diverge from each other away from U-bend 78 to join longitudinally offset strips 70. See FIG. 10.

Units 42 have two spaced support strips connected by three U-shaped spring arms. Different types of contact units are contemplated, including a unit having two support strips connected by two or more spring arms like arms 72 spaced along the support strips.

Figure 19:
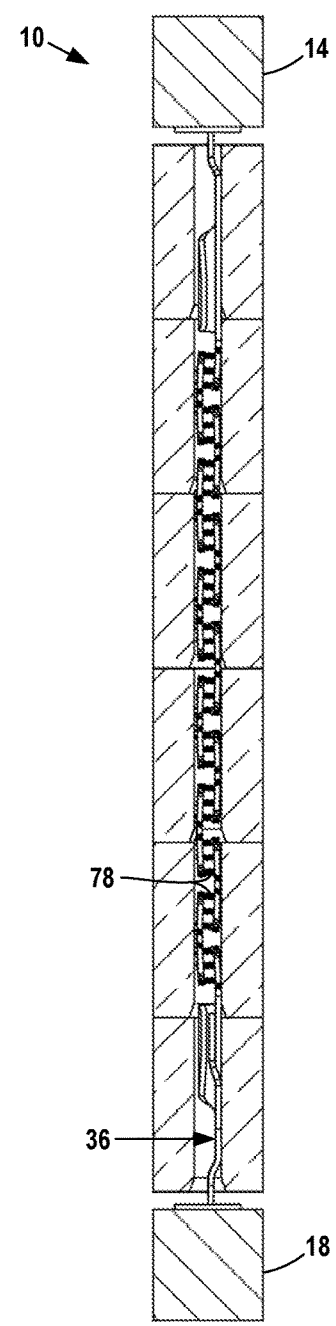

Units 42 are spaced along the length of contact 36 between ends 38 and 40. The two support strips 70 in each unit are each connected to either a contact end or to a support strip in an adjacent unit on different ends of the unit. The bridges 74 between joined support strips 70 of adjacent contact units are positioned on opposite sides of the contact. In this way, the units 42 are arranged in an alternating pattern extending along the length of the contact as shown in FIGS. 19, 25 and 26.

Figure 10:
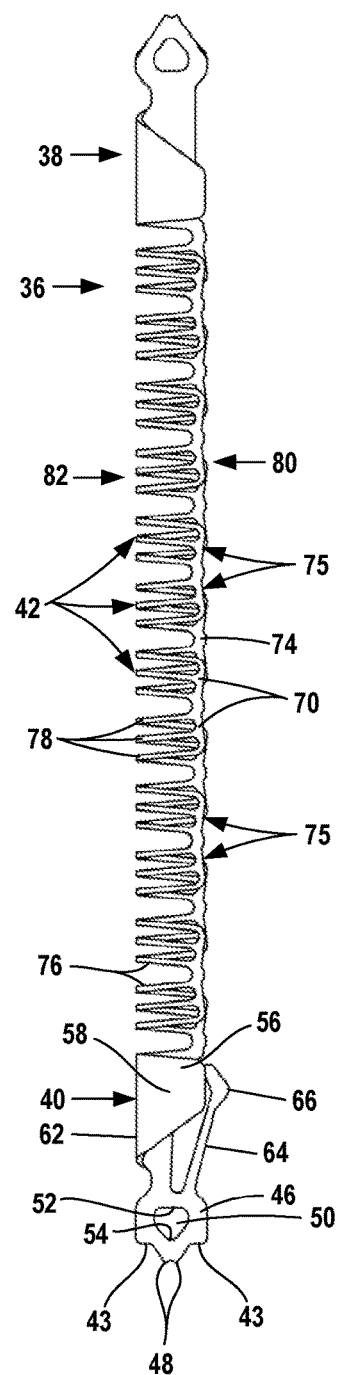
Figure 11:
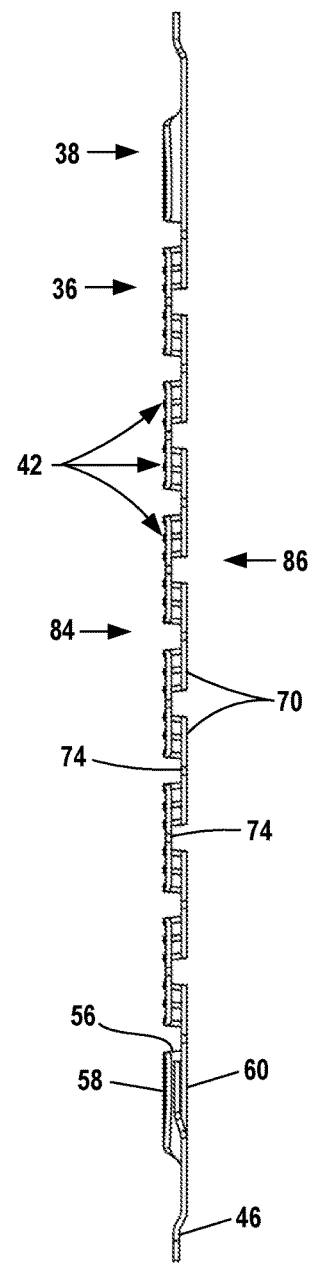
Figure 12:
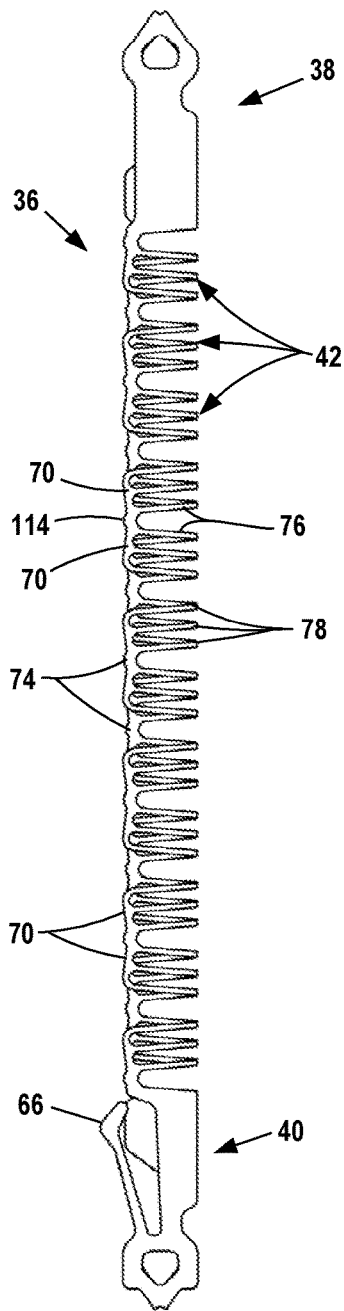

FIGS. 9-12 illustrate uncompressed contact 36 with support strips 70 and bridges 74 located on contact side 80 and U-bends 78 located on contact side 82. The straight spring legs 76 in each unit 42 are located in planes on contact sides 84 and 86 and extend between sides 80 and 82. Alternate bridges 74 are located on opposite contact sides 84 and 86. When contact 36 is uncompressed, the pairs of support strips 70 joined at bridges 74 in adjacent units intersect at an angle 75 slightly less than 180° to each other as shown in FIG. 10.

Each metal contact 36 is inserted into a passage 28 in body 20. Upper contact end 38 is preferably extended into the lower end of a passage at bottom surface 26 and is moved up through the passage to the uncompressed position shown in FIGS. 4 and 5-7 where contact points 48 on ends 38 and 40 are located above and below surfaces 24 and 26. The upper angled surface 68 on end 38 facilitates feeding the end into the lower end of the passage.

Contact 36 has a generally rectangular shape with a free fit in rectangular passage 28. When the contact is fully inserted, attachment member 44 is in the lower rectangular end of a passage and cantilever arm 64 is elastically bent inwardly to bias friction retention projection 66 against the adjacent passage short wall 32 and hold the contact 40 in body 20. Arms 64 hold the contacts in place in assembly 10 until the assembly is sandwiched between substrates 14 and 18. Compression of a contact by the substrates may move the lower end of the contact in passage 28. The upper portion of the contact above the lower end is free to move vertically in the passage.

Figure 17:
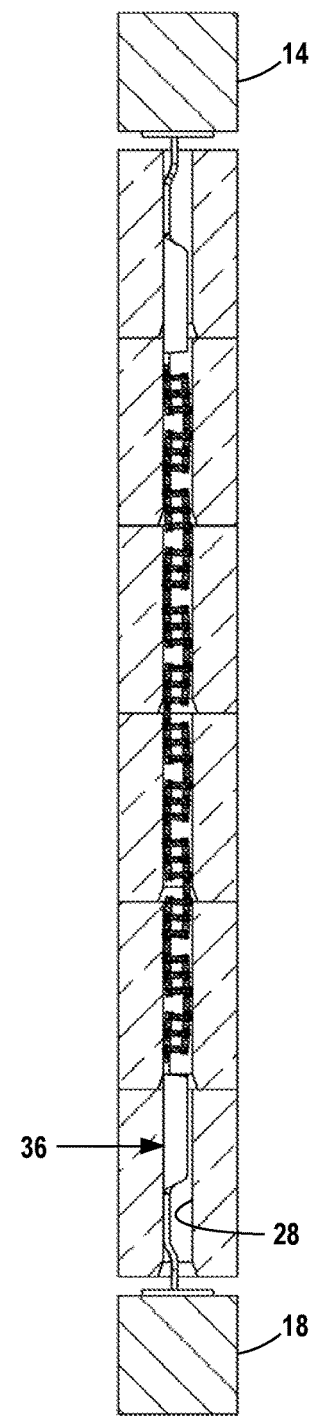
FIGS. 17-19 are sectional views through an assembly and substrates showing a partially compressed contact.
Figure 18:
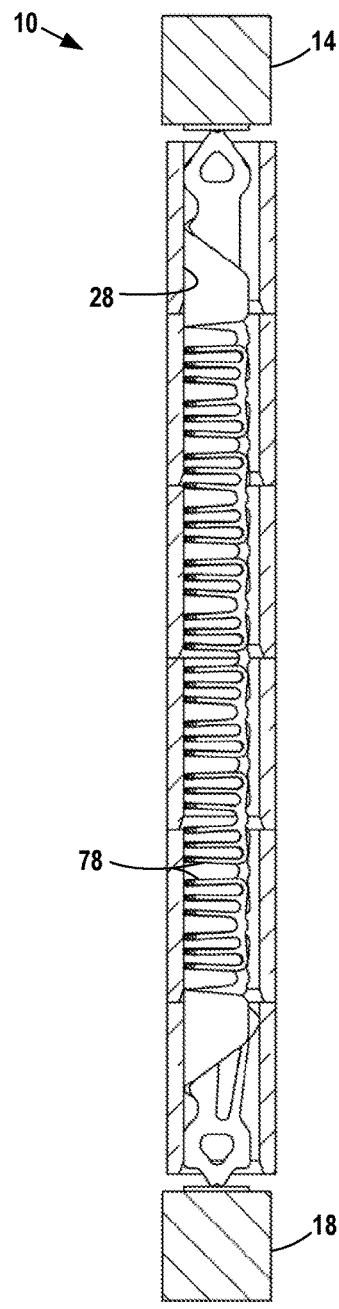

Substrates 14 and 18 are moved toward assembly 10 to the positions of FIGS. 17-19 to establish electrical connections between pairs of pads 12 and 16. The assembly 10 is preferably supported between substrates 14 and 18 with contact points 48 on tips 46 engaging pads 12 and 16. In this position, the vertical height of each contact is partially compressed in a contact passage 28. Vertical compression of the contact elastically stresses the strips 70 and arms 72 in each unit 42. The units move vertically in the passage. The pressure at pads 12 and 16 and the compliance of the contact are not significantly reduced by frictional engagement with body 20.

Vertical compression of a contact 36 in passage 28 moves the units 42 closer to each other to elastically reduce their height and simultaneously bend and rotate the metal in each unit to store energy elastically. Elastic compression of the contact provides high compliance and high contact pressure at points 48.

Figure 13:
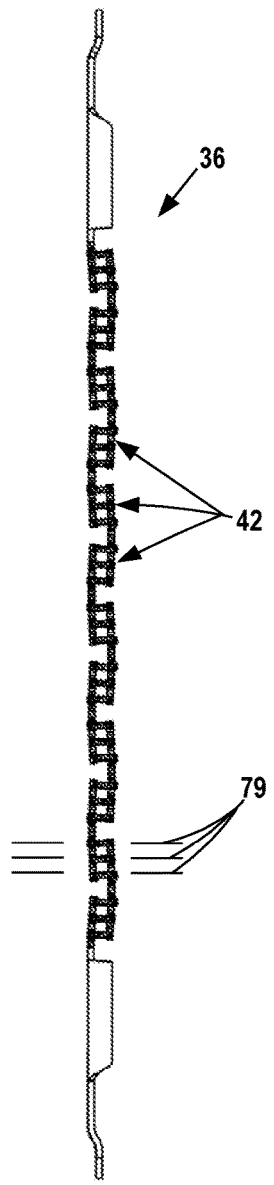
FIGS. 13-16 are side views of a partially compressed contact.
Figure 14:
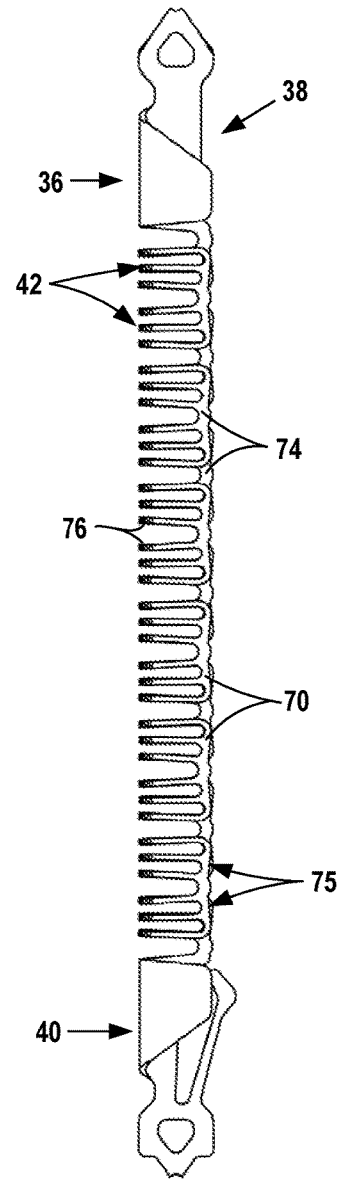
Figure 15:
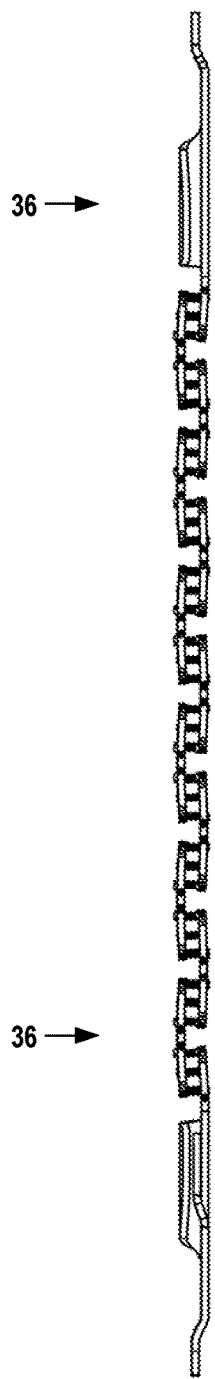
Figure 16:
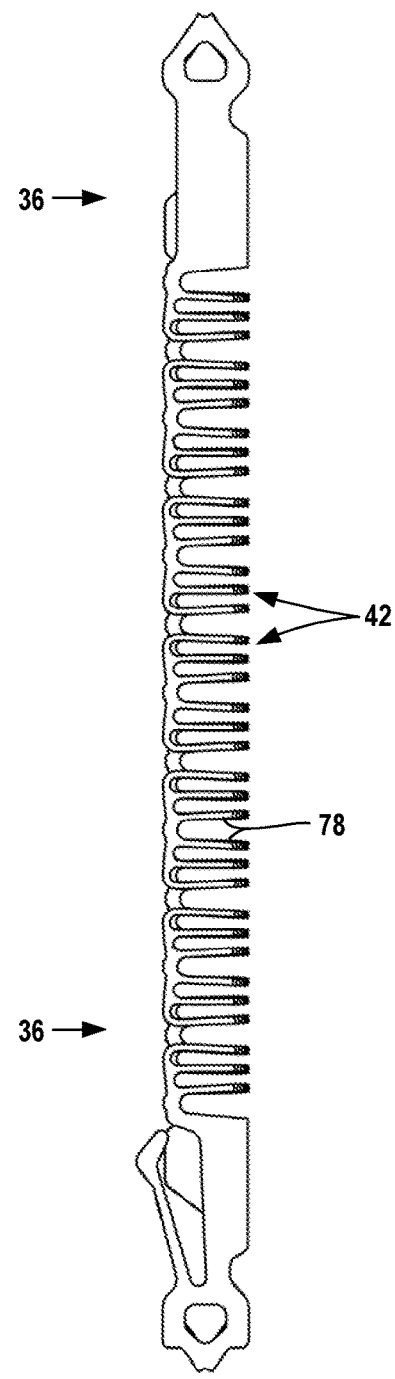

During elastic compression of the contact, the two support strips 70 in each unit 42 are shifted in different directions along the length of passage 28 to reduce the axial height of the unit. When this happens, the legs 76 of the U-shaped spring arms 72 in each unit 42 are rotated together in the passage and are bent from a divergent position to a partially compressed parallel position overlying each other. See FIGS. 17-19. U-bends 78 are twisted about transverse axes 79 as torsion springs as shown in FIG. 13. Axes 79 extend transversely across contact 36 at bends 78.

The spring legs 76 and U-bends 78 in each spring arm 72 are elastically stressed along their lengths as bent cantilever springs and twisted torsion springs. Elastic stressing of the units 42 stores energy and provides compliance along the contact and pressure at points 48. Additionally, the bridges 74 between adjacent strips 70 are elastically bent as the adjacent support strips 70 are stressed and are rotated a short distance toward remote passage short wall 32 to flatten angle 75 shown in FIG. 10.

Compression of the contact 36 in a passage 28 elastically bends and twists the metal in units 42 to maintain highly compliant and reliable connections between points 48 and pads 12 and 16. The sliding fit of contact 36 in passage 28 throughout the range of compression substantially prevents frictional energy loss during compression and decompression. Only a very light normal force of contact with one or two adjacent faces of the passage is necessary to support the contact from free buckling beyond the limits of the passage section.

Current flows through contact 36 with minimized resistance. The support strips 70 on each unit 42 receive current from an adjacent strip 70 and pass the current equally through the three U-shaped U-bends 78. The width of the strips 70 between adjacent units 42 decreases away from bridges 74 primarily to optimize mechanical distribution of stress, while concurrently supporting equal current flow equally through the individual strips 70 of units 42. By increasing cross sectional area appropriately for converging flows of current, total current flows along the length of contacts 36 with minimized resistance and reduced localized heat buildup.

Figures 20, 21, 22, 23:
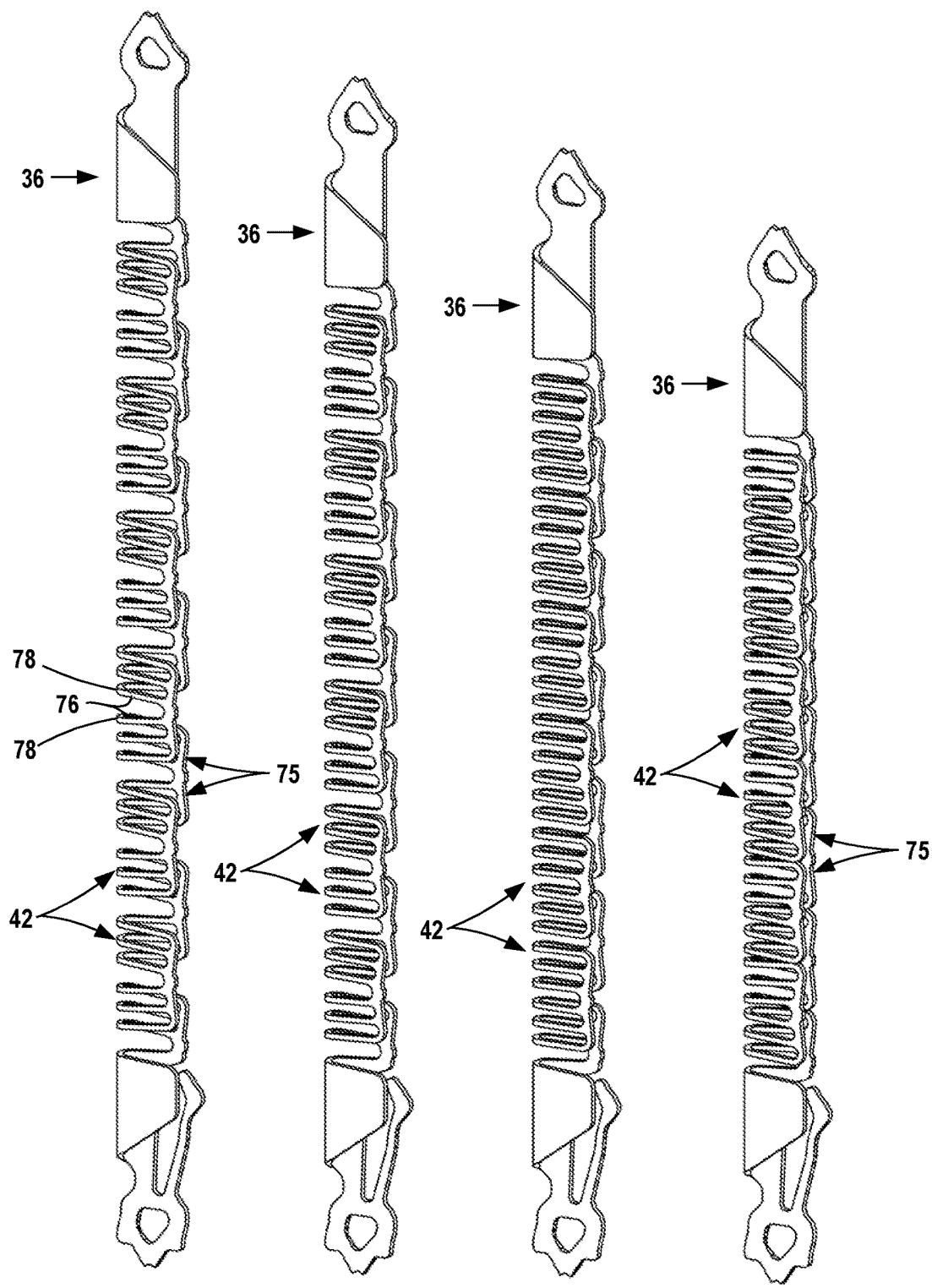
FIGS. 20-23 are perspective views of uncompressed, partially compressed, further compressed and fully compressed contacts, respectively.

FIGS. 20-23 illustrate vertical compression of contact 36. FIG. 20 shows the contact uncompressed where the metal in each unit 42 is not stressed. In this position, spring legs 76 in each unit 42 extend at an angle away from U-bends 78.

FIG. 21 illustrates a contact 36 partially compressed in a passage 28. Legs 76 in each spring arm 72 have been rotated towards each other. Angles 75 are increased as the contact is compressed.

FIGS. 21 and 22 illustrate further compression of contact 36 with legs 76 rotated above each other, angle 75 increased and units 42 moved closer together.

FIG. 23 illustrates full compression of contact 36. In this position, the ends of strips 70 in adjacent units 42 abut each other, and the metal in the units is elastically twisted and bent to store energy. Despite full compression and twisting and bending of the units, the units are not permanently deformed to permit full expansion of the contact to the position of FIG. 20. Thus, contacts 36 may be fully compressed with the units abutting each other and then released without impairing spring or electrical performance.

During compression of contacts 36 as shown in FIGS. 20-23, the contacts are held in assembly passages 28 by light friction. Compression of contacts 36 slightly varies the size of the contact but does not enlarge the contact sufficiently to engage the passage sidewalls. The contact is free to collapse and expand as described within the designed range of compression travel.

FIGS. 20-23 illustrate contact 36 compressed from its full length shown in FIG. 20 to a compressed length shown in FIG. 23. The fully compressed length is approximately 15% shorter than the fully expanded length. Normally, contacts 36 are positioned in bodies 20 having a thickness sufficient to prevent compression of the contact to the fully compressed length shown in FIG. 23. If desired, the compliance of a particular contact 36 may be reduced by reducing the number of units spaced along the contact. The contact would include upper and lower ends and a number of units 42 connected to the ends.

FIGS. 24, 25 and 26 are side views of a contact 36. FIG. 24 shows the contact when uncompressed where bridges 74 and adjacent support strips 70 are flat and the U-shaped spring arms 72 extending between each pair of support strips 70 are angled away from bridges 74.

FIG. 25 shows the contact partially compressed with support strips 70 and bridges 74 bent outwardly to opposed sides of the strip to reduce angle 75, and the spring arms 72 are bent parallel to each other.

FIG. 26 illustrates the contact when fully compressed with adjacent strips 70 on each side of the contact abutting each other. The strips and bridges are bowed outwardly further, and the arms 72 are fully bent and twisted for energy storage. FIGS. 25 and 26 show the zigzag or meandering shape of the contact when compressed.

Contact 36 may be manufactured from copper strip stock without reliance on the most expensive strengthening alloys, such as heat-treated beryllium copper. Strengthening alloys improve contact performance but also increase the cost of material and processing. Contacts 36 achieve desired compliance and conductivity using non-beryllium alloys which do not require heat treatment.

Figure 28:
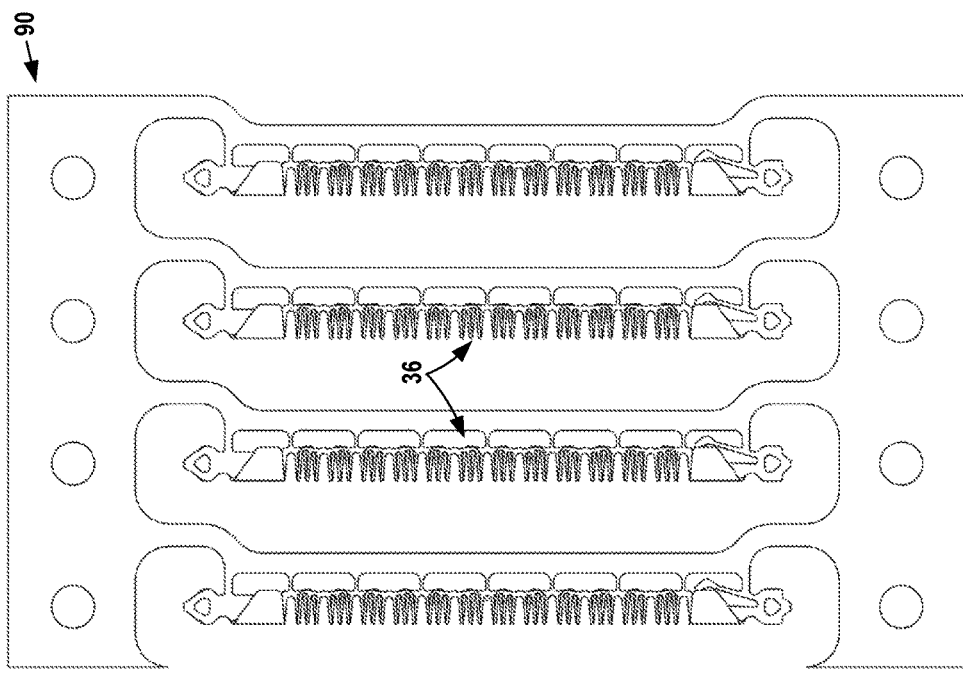
FIGS. 27 and 28 are views of a carrier strip during manufacture of interposer assembly contacts.
Figure 27:
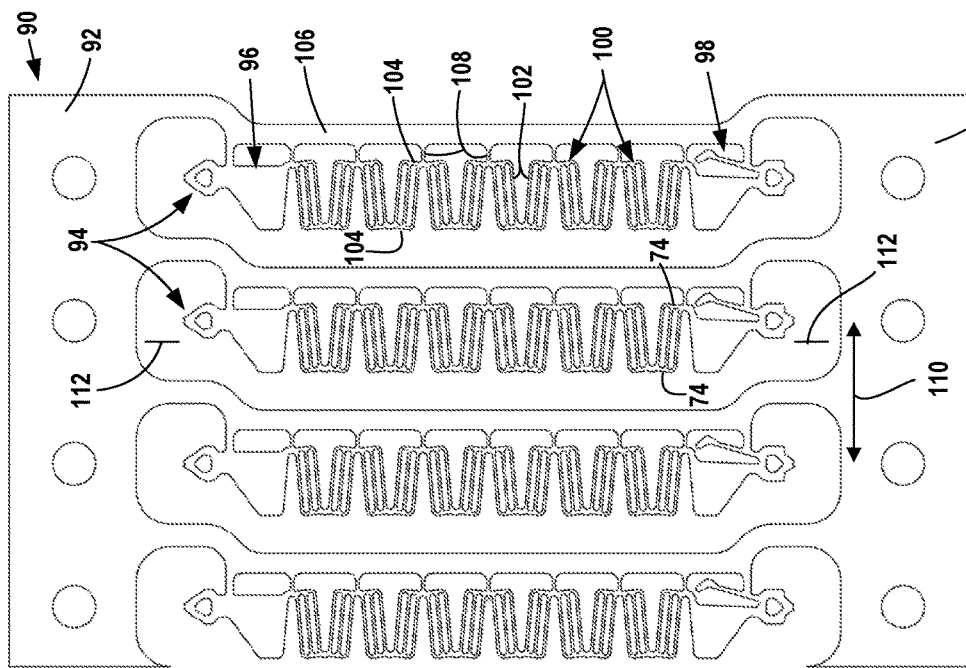

FIGS. 27 and 28 illustrate manufacture of contacts 36 from a conductive metal strip 90. Strip 90 has two elongate carriers 92 and a plurality of flat contact preforms 94 extending between the carriers. Contacts 36 and strip 90 from which the contacts are formed may have a thickness of 50 microns. Preforms 94 may be formed from strip 90 by mechanically cutting the strip or by etching the strip. Strip 90 is typically rolled flat and has a grain axis direction 110 extending along the length of the strip.

Each contact preform 94 includes an upper end portion 96, a lower end portion 98 and a plurality of angled three-strip contact unit portions 100 spaced between portions 96 and 98. Each portion 100 has three parallel, square beams 102 and opposed end support strips 104. The preforms 94 are connected to carrier strip support rail 106 at join strips 108.

Contacts 36 are formed from preforms 94 by bending the beams 102 about fold axes 112 perpendicular to strips 92 to position the preform bridges 74 on each edge of the preform 94 over each other and form folded contacts 36 as shown in FIG. 28.

The interior radius at U-bends 78 is very small, and may be equal to the thickness of the strip. Bending of the preform about an axis 112 which is perpendicular to grain axis 110 is desirable and is easier than bending the preform about an axis not parallel to the grain axis.

After folding, the contacts are severed from the strip and processed before insertion into passages 28.

Contacts 36 may be coated as required with layers of metal as necessary to achieve environmental and conductivity requirements. The upper and lower contact ends 38 and 40 may additionally be coated with a noble material, such as gold, to assure reliable electrical contact with substrate pads 12 and 16.

Formed contacts 36 are removed from strip 90 by severing join strips 108 flush against the adjacent support strips 70 resulting in vestige nubs 114 on the strips 70. Nubs 114 are below the outer raised ends of strips 70 to prevent the cut nub surfaces from engaging the adjacent surface of a passage 28 into which the contact is inserted.

Metal contact 36 may have an uncompressed height between tips of 10.8 mm. Passage 28 may have transverse dimensions of 0.700 mm and 0.245 mm. Body 20, which supports contacts with twelve spring units, may have a thickness of 9.5 mm.

The invention claimed is:
1. An interposer assembly for forming electrical connections between contacts on opposed substrates,
the assembly comprising an insulating plate having a top surface, a bottom surface, a thickness between the top surface and the bottom surface, and a plurality of contact passages in the plate extending between the top surface and the bottom surface;

and a plurality of one-piece electrical contacts, each contact positioned in a contact passage and comprising a first contact end at one surface, a second contact end at the other surface, each contact comprising a contact retention member having an arm, the arm having a friction retention surface on an end of the arm, such surface engaging the interior of the contact passage, and a contact unit in the contact passage, the contact unit comprising a plurality of parallel-oriented elastic torsion and elastic cantilever springs and two spaced strips, said springs extending between said strips whereby movement of the substrates towards the plate to establish electrical connections between the contact ends and the pads on the substrates reduces a height of the contact unit in the contact passage by simultaneous elastic twisting and elastic bending of the torsion and cantilever spring in the passage to provide contact pressure between the contact ends and pads.

2. The assembly as in claim 1 each contact retention member engages a passage wall for retention of the contact in the contact passage before the plate is positioned between the substrates.

3. The assembly as in claim 2 wherein each contact comprises a plurality of series-oriented contact units spaced along the length of the contact and located in the contact passage, each contact unit comprising a one-piece elastic torsion and elastic cantilever spring.

4. The assembly as in claim 3 wherein said strips extend along the length of the contact passage.

5. The assembly as in claim 3 wherein said springs are U shaped and each includes a U-bend away from said strips.

6. The assembly as in claim 5 wherein metal in each contact has a roll axis, and the roll axis is transverse to the U-bends.

7. The assembly as in claim 5 wherein each spring includes spring legs between the U-bend and the spaced strips.

8. The assembly as in claim 7 comprising bridges joining strips in adjacent contact units.

9. The assembly as in claim 7 wherein each said contact passage comprises opposed long walls and opposed short walls, said U-bends and said strips adjacent opposed short walls, said legs adjacent opposed long walls.

10. The assembly as in claim 9 wherein said long walls have a length of 0.700 mm and said short walls have a length of 0.245 mm.

11. The assembly as in claim 10 wherein the contact has an uncompressed height of 10.8 mm.

12. The assembly as in claim 2 wherein each contact includes a U-shaped attachment member adjacent a contact end, each member in the contact passage.

13. The assembly as in claim 1 wherein the friction retention surface on the end engages the interior of the passage to retain the contact in the passage but allow shifting of the contact along the passage.

14. The assembly as in claim 1 wherein the contact passage has a uniform cross section.

15. The assembly as in claim 14 wherein said contact passage has a rectangular cross section.

16. The assembly as in claim 1 wherein the contact includes a plurality of contact units spaced along a length of the contact in a meandering pattern.

17. An interposer assembly for forming electrical connections between contacts on opposed substrates, the assembly comprising an insulating plate, a plurality of through passages extending through the plate, a plurality of one-piece metal contacts in the passages;

each contact comprising opposed ends located at top and bottom surfaces of the plate, a contact retention member having an arm with an arm surface engaging a side of one of said passages to moveably hold the contact in the one of said passages, and a plurality of contact units spaced along the one of said passages, each contact unit comprising a plurality of combination cantilever and torsion spring members extending between two spaced apart strips, each contact unit having an uncompressed length extending along the one of said passages and a compressed length extending along the one of said passages less than the uncompressed length, wherein when said contacts are compressed in said one of said passages the spring members are simultaneously elastically twisted and elastically bent to store energy, such stored energy recoverable when the contact is released and the spring members expand to the uncompressed length.

18. The assembly as in claim 17 wherein each contact unit includes a U-shaped torsion and cantilever spring member, each one of said passages has a rectangular configuration, and the spring members have a sliding fit in the passage.

19. The assembly as in claim 17 wherein each contact unit including two spaced support members and a plurality of spaced spring arms extending between the support members, said support members located adjacent one passage wall and said spring arms located adjacent an opposite passage wall, said spring arms extending along the one of said passages when the contact unit is not compressed, whereby compression of the contacts in one of said passages elastically twists the spring arms as torsion springs and elastically bends the spring arms as cantilever beams simultaneously.

20. The assembly as in claim 19 wherein said passages each have two opposed long sides and two opposed short sides, said support members adjacent one short side, said spring arms each including a U-bend, said U-bends adjacent the other short side of one of said passages.

21. The assembly as in claim 19 wherein each retention member arm is elastically compressed when the contact is in one of said passages so that the arm surface is held against a passage wall to retain the contact in one of said passages while permitting movement of the contact in one of said passages.

22. An interposer assembly comprising an insulating body with opposed parallel surfaces, a plurality of contact passages in the body extending between the surfaces, each contact passage having two opposed passage walls and a uniform cross section between the surfaces;

and a metal contact in each passage, each contact comprising two contact ends at body surfaces to engage pads on substrates, a contact unit comprising a plurality of parallel-oriented elastic torsion and elastic cantilever springs and two spaced strips, said springs extending between said spaced strips, a first conductor extending from one support strip along the contact passage to one contact end, and a second conductor extending from the other support member along the contact passage to the other contact end, a retention member comprising an arm having a friction retention surface on the end of the arm, the friction retention surface engaging the body wherein said contact ends extend outwardly of said surfaces and movement of the contact ends toward the body moves the spaced strips along the contact passage in opposite directions to elastically flex and twist the spring arms simultaneously.

23. The assembly as in claim 22 wherein the friction retention surface engages the body to retain the contact in one of said passages but allows shifting of the contact along the passage.

24. The assembly as in claim 22 including means in each support strip for equalizing flow of electricity along the spring arms.

25. The assembly as in claim 22 wherein the two spaced strips overlie each other adjacent one contact passage wall.

* * * * *